(12) United States Patent
Cheng et al.

(10) Patent No.: US 8,031,467 B2
(45) Date of Patent: Oct. 4, 2011

(54) HEAT DISSIPATION SYSTEM AND ELECTRONIC DEVICE USING THE SYSTEM

(75) Inventors: Hao-Der Cheng, Taipei Hsien (TW); Wen-Tang Peng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 39 days.

(21) Appl. No.: 12/639,004

(22) Filed: Dec. 16, 2009

(65) Prior Publication Data
US 2011/0116221 A1    May 19, 2011

(30) Foreign Application Priority Data
Nov. 16, 2009   (TW) .............................. 98138907 A

(51) Int. Cl.
  *H05K 7/20* (2006.01)
  *H05K 5/00* (2006.01)
(52) U.S. Cl. ........................................ 361/694; 454/184
(58) Field of Classification Search .......... 361/694–695; 454/184
See application file for complete search history.

(56) References Cited

U.S. PATENT DOCUMENTS

| | | | | |
|---|---|---|---|---|
| 6,042,474 A * | 3/2000 | Harvey et al. | ................. | 454/184 |
| 6,654,252 B2 * | 11/2003 | Raynham | ....................... | 361/727 |
| 6,655,908 B2 * | 12/2003 | Huang et al. | ................. | 415/53.1 |
| 6,865,078 B1 * | 3/2005 | Chang | ............................ | 361/695 |
| 7,054,155 B1 * | 5/2006 | Mease et al. | ................. | 361/695 |
| 7,126,818 B2 * | 10/2006 | Lu et al. | ........................ | 361/695 |
| 7,342,786 B2 * | 3/2008 | Malone et al. | ................ | 361/695 |
| 7,630,198 B2 * | 12/2009 | Doll | ........................ | 361/679.49 |
| 7,639,496 B2 * | 12/2009 | Lv et al. | ....................... | 361/695 |
| 2004/0207983 A1 * | 10/2004 | Lu et al. | ....................... | 361/695 |
| 2006/0120040 A1 * | 6/2006 | Chen | ............................ | 361/695 |
| 2009/0022588 A1 * | 1/2009 | Chen | ......................... | 415/218.1 |
| 2010/0033930 A1 * | 2/2010 | Wada | ............................ | 361/695 |

* cited by examiner

*Primary Examiner* — Gregory Thompson
(74) *Attorney, Agent, or Firm* — Altis Law Group, Inc.

(57) ABSTRACT

An electronic device includes a server, a plurality of fans, a fan holder attached to one outer side of the server and a plurality of fan ducts received in the fan holder. The server defines an inner cavity therein. Each fan is centrifugal fan and has a fan intake and a fan outlet perpendicular to the fan intake. The fan holder accommodates the fans therein. Each fan duct has an inlet communicating with the fan outlet and an outlet communicating with the inner cavity of the server through the fan holder to allow airflow from the fans into the server.

17 Claims, 3 Drawing Sheets

HEAT DISSIPATION SYSTEM AND ELECTRONIC DEVICE USING THE SYSTEM

BACKGROUND

1. Technical Field

The present disclosure relates to a heat dissipation system and an electronic device using the system.

2. Description of Related Art

Electronic components, such as central processing units (CPUs), generate heat during normal operation, which can deteriorate their operational stability, and damage associated electronic components. Thus, the heat must be removed quickly to ensure normal operation of the CPU. An electronic device such as a server utilizing multiple heat-generating components such as CPUs therein requires a powerful heat dissipation system. The heat dissipation system for the server often includes a plurality of fans mounted inside of the server for accelerating airflow therethrough. However, the heat dissipation system is inherently mounted in the server, such that when the server requires updating or replacement, the heat dissipation system must be abandoned accordingly.

What is needed, therefore, is a heat dissipation system can be reused in multiple servers.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
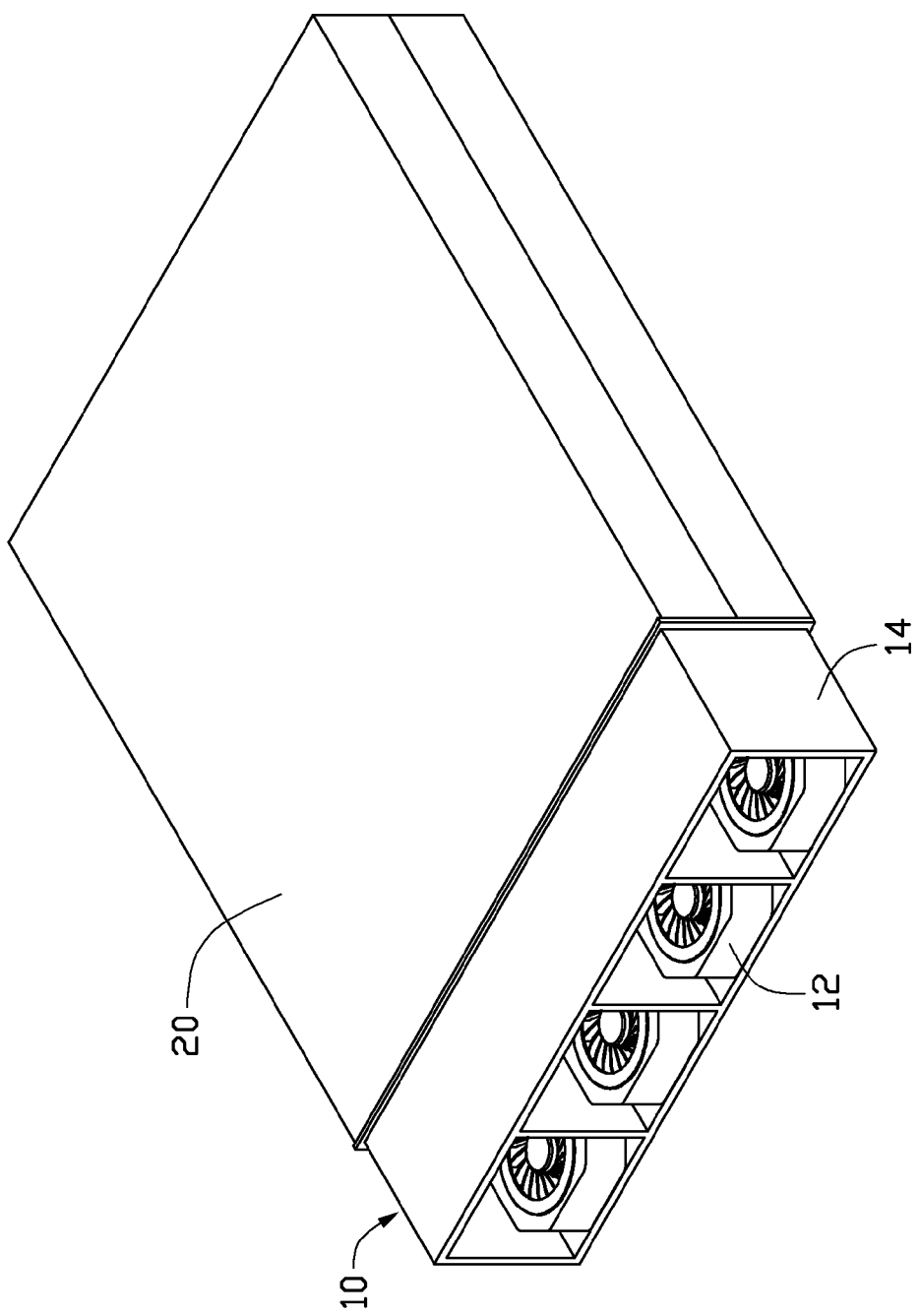
FIG. 1 is an assembled view of a heat dissipation system in accordance with an embodiment, applied in a server.
Figure 2:
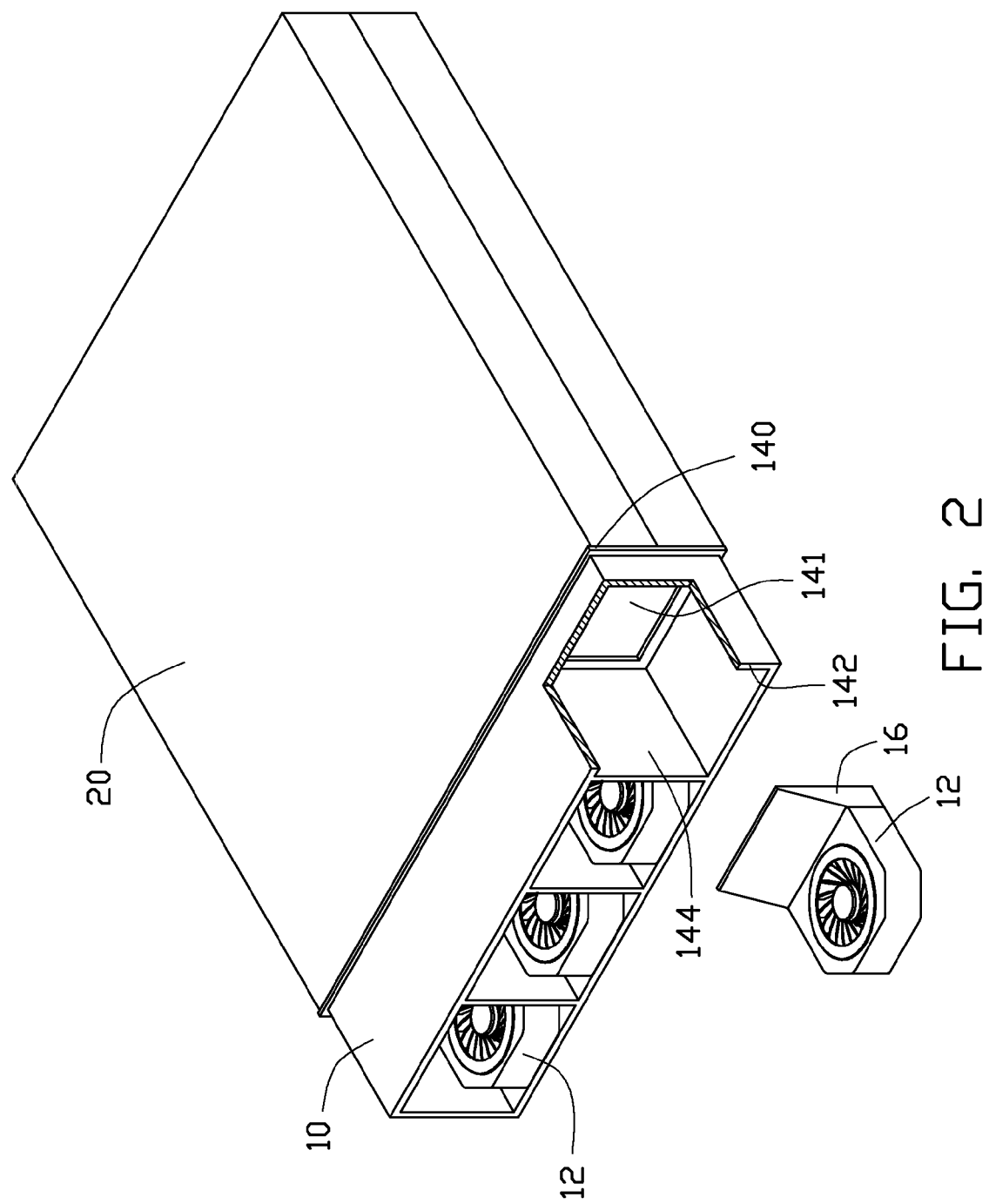
FIG. 2 is a partially exploded view of the heat dissipation system of FIG. 1, with a portion thereof cut away for purpose of clarity.

Referring to FIGS. 1 and 2, an electronic device according to an embodiment of the disclosure includes a server 20 and a heat dissipation system 10 mounted on an outer side of the server 20 to remove heat therefrom. The server 20 has different configurations in different embodiments. In this embodiment of the disclosure, the server 20 is a 2U server of standard 2U size.

The heat dissipation system 10 includes a plurality of fans 12, a fan holder 14 securing the fans 12 to an outer side of the server 20 and a plurality of fan ducts 16 received in the fan holder 14 and directing airflow from the fans 12 into the server 20. The fans 12 are centrifugal fans and generate airflow in a direction perpendicular to the rotation axes thereof. Each fan 12 has a fan intake in the top thereof and an fan outlet in a circumferential side thereof for airflow. The fan outlets of the fans 12 fully communicate with an inner cavity of the server 20 through the fan holder 10.

The fan holder 14 comprises a mounting plate 140 attached to the outer side of the server 20 and a framework 142 fixed on an outer side of the mounting plate 140. In this embodiment of the disclosure, the mounting plate 140 is attached to and wholly covers a rear side of the server 20 which is hollow to allow airflow generated by the fans 10 to flow therethrough. A plurality of vents 141 is defined in the mounting plate 140 and arranged evenly in a line on the rear side of the server 20. A plurality of pane units 144 are formed in the framework 142 and arranged in a line continuously along the rear side of the server 20. Each vent 141 in the mounting plate 140 corresponds to one pane unit 144 and enables the pane unit 144 to communicate with the cavity inside the server 20 through the vent 141 and the rear side of the server 20. Each vent 141 is rectangular and is of a size larger than that of the fan outlet of the fan 12.

Each fan duct 16 defines a channel therein for airflow and has a small end and a large end opposite to the small end. The fan duct 16 has a configuration gradually expanding from the small end to the large end thereof. The fan duct 16 defines an inlet for the channel in the small end thereof and an outlet for the channel in the large end thereof.

In use, the fans 12, fit in the pane units 144 of the framework 142 and face the vents 141 of the mounting plate 140. Each fan 12 occupies only a lower portion of the pane unit 144. The fan ducts 16 are received in the pane units 144 and located between the fan outlets and the mounting plate 140. The large ends of the fan ducts 16 abut an outer side of the mounting plate 140, while the small ends of the fan ducts 16 abut the circumferential side of the fans 12. The inlets and outlets of the fan ducts 16 respectively communicate with the fan outlets and the vents 141 allowing airflow generated by the fans 12 to flow through the vents 141 into the server 20. The fans 12 mounted outside of the server 20 easily generate airflow through the server 20, exhausting heat generated thereby to the exterior, thus lowering internal temperature of the server 20.

Figure 3:
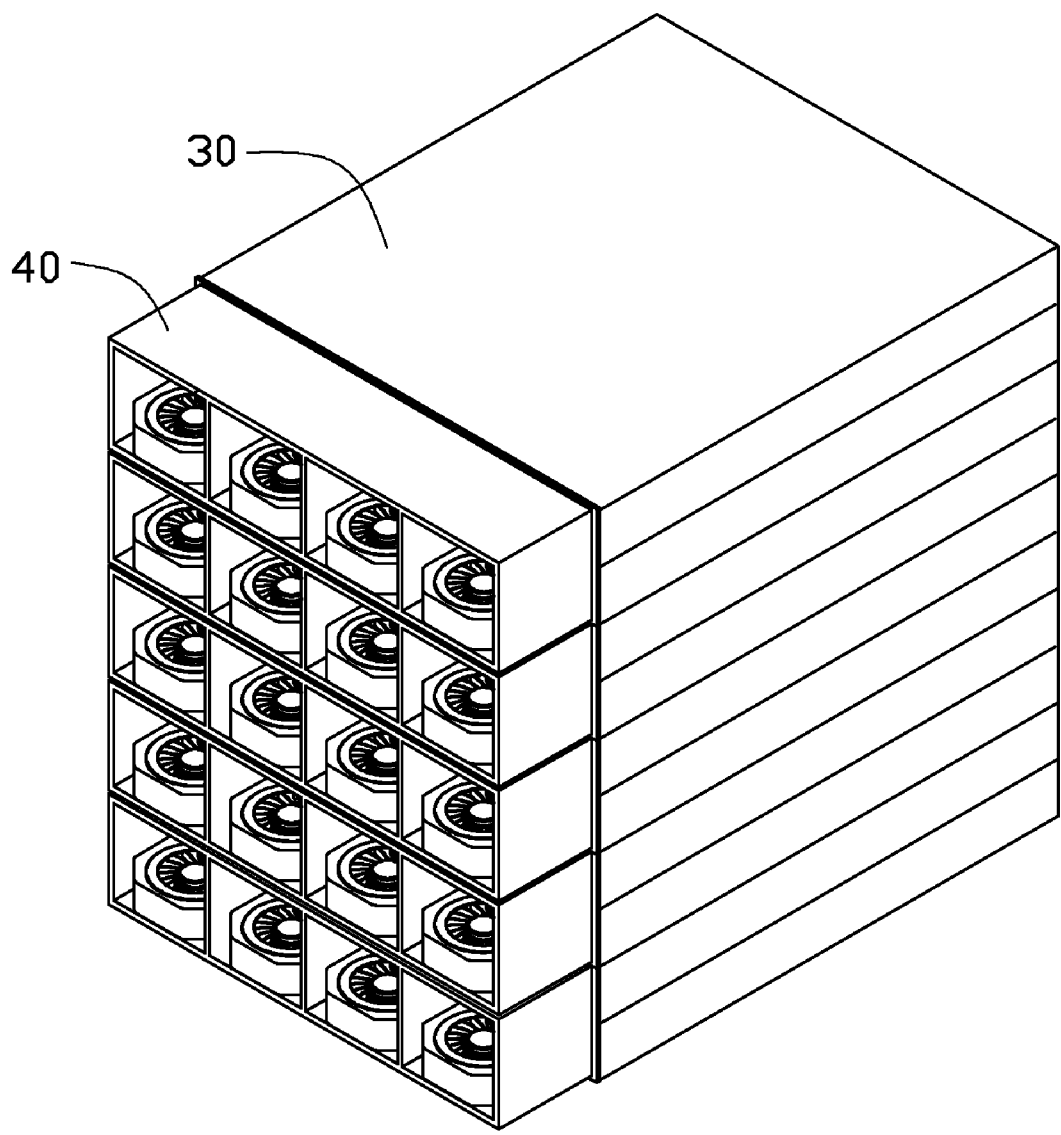
FIG. 3 is an assembled view of a heat dissipation system in accordance with another embodiment, applied in multiple servers.

Referring to FIG. 3, a heat dissipation system 40 is applied in a server 30, being much larger than server 20. The heat dissipation system 40 is formed by multiple heat dissipation systems 10 of the above embodiment grouped and coupled together to accommodate server 30 of multiple U sizes.

According to the disclosure, a heat dissipation system is detachably coupled to an outer side of a server and can be reused with a different server when removed from the original server. In addition, fans mounted outside of the server by the fan holder can be replaced as needed to increase airflow in the server with no need for available space consideration inside the server.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation system for dissipating heat from a server, the heat dissipation system comprising:
    a plurality of centrifugal fans, each of the fans comprising a fan intake and a fan outlet perpendicular to the fan intake;

a fan holder adapted for securing the fans onto an outer side of the server; and a plurality of fan ducts received in the fan holder for directing airflow generated by the fans into the server, each fan duct being adjacent to a corresponding fan, and each fan duct positioned between the corresponding fan and the server when the heat dissipation system dissipates heat from the server;

wherein the fan outlets are positioned to communicate with the server through the fan holder and the fan ducts and conduct airflow into the server when the heat dissipation system dissipates heat from the server.

2. The heat dissipation system of claim 1, wherein a plurality of vents is defined in the fan holder for exhausting the airflow of the fans to an inner cavity of the server, the vents communicating with the fan outlets of the fans via the fan ducts respectively.

3. The heat dissipation system of claim 2, wherein the fan holder comprises a mounting plate for being attached to the outer side of the server, on which the vents are defined.

4. The heat dissipation system of claim 3, wherein each fan duct comprises a small end abutting a circumferential side of one corresponding fan of the fans and a large end abutting the mounting plate, an inlet being defined in the small end of each fan duct and communicating with the fan outlet of the corresponding fan, an outlet being defined in the large end and communicating with a corresponding vent of the vents of the mounting plate.

5. The heat dissipation system of claim 3, wherein the fan holder further comprises a framework fixed to an outer side of the mounting plate and in which the fans and fan ducts are received.

6. The heat dissipation system of claim 5, wherein a plurality of pane units are formed in the framework and accommodate the fans therein, respectively.

7. The heat dissipation system of claim 6, wherein each fan occupies only a lower portion of the corresponding pane unit.

8. The heat dissipation system of claim 6, wherein the pane units cover the outer side of the mounting plate, and the pane units are arranged continuously along the length of the outer side of the server when the heat dissipation system dissipates heat from the server.

9. The heat dissipation system of claim 6, wherein the pane units are arranged in multiple arrays and cover the outer side of the mounting plate.

10. An electronic device, comprising:
a server defining an inner cavity therein;
a plurality of fans, each being centrifugal and comprising a fan intake and a fan outlet perpendicular to the fan intake;
a fan holder attached to one outer side of the server and accommodating the fans therein; and
a plurality of fan ducts received in the fan holder, each fan duct comprising an inlet communicating with the fan outlet of one corresponding fan, and an outlet communicating with the inner cavity of the server through the fan holder to allow airflow from the fans into the server.

11. The electronic device of claim 10, wherein a plurality of vents is defined in the fan holder, each vent communicating with the inner cavity of the server, and communicating with the outlet of one corresponding fan duct.

12. The electronic device of claim 11, wherein the fan holder comprises a mounting plate attached to the outer side of the server, on which the vents are defined, the fan ducts being located between the mounting plate and the fans.

13. The electronic device of claim 12, wherein each fan duct comprises a small end abutting a circumferential side of the corresponding fan and a large end abutting the mounting plate, the inlet defined in the small end and communicating with the fan outlet of the corresponding fan, the outlet defined in the large end and communicating with the corresponding vent.

14. The electronic device of claim 12, wherein the fan holder comprises a framework fixed to an outer side of the mounting plate and in which the fans and fan ducts are received.

15. The electronic device of claim 14, wherein a plurality of pane units are formed in the framework and accommodate the fans therein, respectively.

16. The electronic device of claim 15, wherein each fan occupies only a lower portion of the corresponding pane unit.

17. The electronic device of claim 15, wherein the pane units are arranged continuously along the length of the outer side of the server and cover the outer side of the mounting plate.

* * * * *